(12) United States Patent
Li et al.

(10) Patent No.: US 11,784,038 B2
(45) Date of Patent: Oct. 10, 2023

(54) METHOD AND DEVICE FOR PREFERENTIAL ETCHING OF DISLOCATION OF SILICON CARBIDE WAFER

(71) Applicant: ZJU-Hangzhou Global Scientific and Technological Innovation Center, Hangzhou (CN)

(72) Inventors: Jiajun Li, Hangzhou (CN); Rong Wang, Hangzhou (CN); Xiaodong Pi, Hangzhou (CN); Deren Yang, Hangzhou (CN)

(73) Assignee: ZJU-Hangzhou Global Scientific and Technological Innovation Center, Hangzhou (CN)

( * ) Notice: Subject to any disclaimer, the term of this patent is extended or adjusted under 35 U.S.C. 154(b) by 0 days.

(21) Appl. No.: 18/085,600

(22) Filed: Dec. 21, 2022

(65) Prior Publication Data
US 2023/0123599 A1    Apr. 20, 2023

(30) Foreign Application Priority Data
Mar. 14, 2022   (CN) .......................... 202210244788.5

(51) Int. Cl.
*H01L 21/02*    (2006.01)
(52) U.S. Cl.
CPC .............................. *H01L 21/02002* (2013.01)

(58) Field of Classification Search
CPC ...................... H01L 21/02002; H01L 21/3065
USPC ............................................ 438/706; 216/73
See application file for complete search history.

(56) References Cited

U.S. PATENT DOCUMENTS

| 2006/0267024 | A1* | 11/2006 | Murphy | ............ | H01L 21/02002 |
|---|---|---|---|---|---|
| | | | | | 257/77 |
| 2008/0318359 | A1* | 12/2008 | Yonezawa | ......... | H01L 21/02658 |
| | | | | | 438/105 |
| 2022/0282395 | A1* | 9/2022 | Kaneko | ................... | C30B 33/12 |

FOREIGN PATENT DOCUMENTS

| JP | 2011011926 A | 1/2011 | | |
|---|---|---|---|---|
| WO | WO-2022058743 A2 * | 3/2022 | ....... | H01L 21/02002 |

* cited by examiner

*Primary Examiner* — Duy Vu N Deo
(74) *Attorney, Agent, or Firm* — Zhigang Ma

(57) ABSTRACT

The present disclosure relates to the technical field of silicon carbide processing, and discloses a method and device for preferential etching of dislocation of a silicon carbide wafer. According to the method and device of the present disclosure, a concentration of the etchant is effectively reduced while the high-temperature etching activity is guaranteed, the dislocations on the carbon surface and the silicon surface of the silicon carbide wafer are exposed, and dislocation etching pits with high distinguishing degree are obtained on the carbon surface and the silicon surface of the silicon carbide wafer and thus identified clearly.

6 Claims, 2 Drawing Sheets provide a silicon carbide wafer and place the silicon carbide wafer in a crucible, wherein the crucible contains an etchant and a silicon carbide accompanying wafer therein, the silicon carbide accompanying wafer is placed above the etchant and the silicon carbide wafer is placed above the silicon carbide accompanying wafer; the silicon carbide accompanying wafer includes a first surface and a second surface, wherein the first surface of the silicon carbide accompanying wafer faces the etchant, the second surface of the silicon carbide accompanying wafer faces a carbon surface of the silicon carbide wafer, a size of the silicon carbide accompanying wafer is matched with that of the inner wall of the crucible, a gap is reserved between the side edge of the silicon carbide accompanying wafer and the inner wall of the crucible, and a distance between the carbon surface of the silicon carbide wafer and the second surface of the silicon carbide accompanying wafer is smaller than or equal to a predetermined distance ~S100 heat the crucible based on a heating process, wherein etchant vapor formed by heating etches the silicon carbide wafer and the silicon carbide accompanying wafer to obtain the etched silicon carbide wafer ~S200

FIG. 1

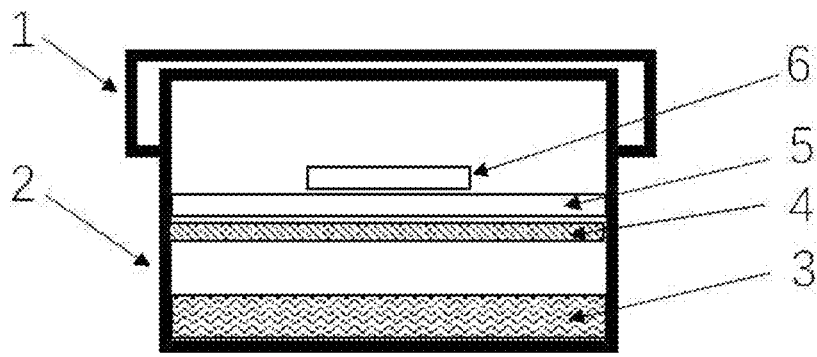

FIG. 2

METHOD AND DEVICE FOR PREFERENTIAL ETCHING OF DISLOCATION OF SILICON CARBIDE WAFER

TECHNICAL FIELD

The present disclosure relates to the technical field of silicon carbide processing, in particular to a method and device for preferential etching of dislocation of a silicon carbide wafer.

BACKGROUND ART

Silicon carbide is a representative material of the third-generation semiconductor industry, and has important research values in many fields such as new energy vehicles, photovoltaics, and power grids. In material applications, dislocations are one of the important factors that affect device performances. Therefore, dislocation characterization of silicon carbide wafers has become an important topic. Alkaline etching is currently an important means to reveal dislocations of silicon carbide wafers. Due to the lattice distortion caused by a dislocation, a reaction rate of the dislocation with an etchant is different from that of a dislocation-free region. Dislocation etching pits can be obtained on the wafer surface by controlling an appropriate etching reaction rate.

However, silicon carbide is a polar material, a carbon surface of which is used for crystal growth, and a silicon surface of which is used for epitaxy. Whether it is crystal growth or epitaxy, the dislocation of a seed crystal from a substrate slice will have an impact on the quality of subsequently grown crystals. The currently commonly used etching method is to immerse the silicon carbide wafer in molten potassium hydroxide liquid and observe it using an optical microscope after a suitable etching process. Threading screw dislocations on the silicon surface appear as large irregular hexagonal etching pits with a large depth and contrast; threading edge dislocations also appear as irregular hexagonal etching pits, but have a smaller size and a smaller contrast than the threading screw dislocations; and basal plane dislocations appears as shell-shapes and have the smallest contrast. However, the carbon surface and the silicon surface have different properties, resulting in a great difference in corrosion effect. In the same case, the carbon surface has a faster corrosion rate, and large etching pits each having a shape similar to a hexagon, such that the types of dislocations cannot be distinguished. However, in the growth of silicon carbide crystals, the carbon surface of the seed crystal is generally used as a growth surface, and the dislocations in the seed crystal will enter grown crystals and directly affect the quality of the grown crystals.

Therefore, there is a need for an etching method that can simultaneously distinguish and count the dislocations on the carbon surface and the silicon surface of the silicon carbide wafer, and provide a technical support for grown crystals.

SUMMARY OF THE INVENTION

An object of the present disclosure is to provide a method and device for preferential etching of dislocation of a silicon carbide wafer in order to overcome the problem that the existing etching methods for distinguishing dislocations of a silicon carbide wafer cannot effectively distinguish dislocations on a carbon surface.

In order to fulfill the above object, the present disclosure provides a method for preferential etching of dislocation of a silicon carbide wafer. The method includes the following steps:

providing a silicon carbide wafer and placing the silicon carbide wafer in a crucible, wherein the crucible contains an etchant and a silicon carbide accompanying wafer therein, the silicon carbide accompanying wafer is placed above the etchant and the silicon carbide wafer is placed above the silicon carbide accompanying wafer; the silicon carbide accompanying wafer includes a first surface and a second surface, wherein the first surface of the silicon carbide accompanying wafer faces the etchant, the second surface of the silicon carbide accompanying wafer faces a carbon surface of the silicon carbide wafer, a size of the silicon carbide accompanying wafer is matched with that of the inner wall of the crucible, a gap is reserved between the side edge of the silicon carbide accompanying wafer and the inner wall of the crucible, and a distance between the carbon surface of the silicon carbide wafer and the second surface of the silicon carbide accompanying wafer is smaller than or equal to a predetermined distance; and heating the crucible based on a heating process, wherein etchant vapor formed by heating etches the silicon carbide wafer and the silicon carbide accompanying wafer to obtain the etched silicon carbide wafer.

As an implementation, the distance between the carbon surface of the silicon carbide wafer and the second surface of the silicon carbide accompanying wafer being smaller than or equal to the predetermined distance includes: contacting the carbon surface of the silicon carbide wafer with the second surface of the silicon carbide accompanying wafer.

As an implementation, the etchant is a potassium hydroxide solid or a sodium hydroxide solid, and the etchant vapor is corresponding potassium hydroxide vapor or sodium hydroxide vapor.

As an implementation, the predetermined distance is 0.5 mm, and a distance range of the gap is 0.5 mm to 5 mm.

As an implementation, a bracket is also disposed in the crucible; and the bracket is used to fix the silicon carbon accompanying wafer.

As an implementation, the crucible is a nickel crucible with a lid, and the bracket is a nickel mesh bracket.

Correspondingly, the present disclosure further provides a device for preferential etching of dislocation of a silicon carbide wafer. The device includes a crucible, wherein the crucible is used to place an etchant, a silicon carbide wafer and a silicon carbide accompanying wafer therein; the silicon carbide accompanying wafer is placed above the etchant and the silicon carbide wafer is placed above the silicon carbide accompanying wafer; the silicon carbide accompanying wafer includes a first surface and a second surface, wherein the first surface of the silicon carbide accompanying wafer faces the etchant, the second surface of the silicon carbide accompanying wafer faces a carbon surface of the silicon carbide wafer, a size of the silicon carbide accompanying wafer is matched with that of the inner wall of the crucible, a gap is reserved between the side edge of the silicon carbide accompanying wafer and the inner wall of the crucible, and a distance between the carbon surface of the silicon carbide wafer and the second surface of the silicon carbide accompanying wafer is smaller than or equal to a predetermined distance; and the crucible is heated based on a heating process, wherein etchant vapor formed by heating etches the silicon carbide wafer and the silicon carbide accompanying wafer to obtain the etched silicon carbide wafer.

As an implementation, the distance between the carbon surface of the silicon carbide wafer and the second surface of the silicon carbide accompanying wafer being smaller than or equal to the predetermined distance includes: contacting the carbon surface of the silicon carbide wafer with the second surface of the silicon carbide accompanying wafer.

As an implementation, the predetermined distance is 0.5 mm, and a distance range of the gap is 0.5 mm to 5 mm.

As an implementation, a bracket is also disposed in the crucible; and the bracket is used to fix the silicon carbon accompanying wafer.

The present disclosure has the following beneficial effects: the present disclosure discloses a method and device for preferential etching of dislocation of a silicon carbide wafer, wherein the etchant vapor at high temperature is used for preferential etching, the etchant vapor is blocked by using the silicon carbide accompanying wafer, and the silicon carbide accompanying wafer and the silicon carbide wafer are synchronously etched to effectively reduce the concentration of the etchant vapor on the carbon surface of the silicon carbide wafer, thereby exposing the dislocations on the carbon surface of the silicon carbide wafer. Therefore, dislocation etching pits with high distinguishing degree are obtained on the carbon surface and the silicon surface of the silicon carbide wafer and thus identified clearly.

BRIEF DESCRIPTION OF THE DRAWINGS

FIG. 1 is a schematic diagram of steps of a method for preferential etching of dislocation of a silicon carbide wafer according to an embodiment of the present disclosure.

FIG. 2 is a schematic sectional view of a device for preferential etching of dislocation of a silicon carbide wafer according to an embodiment of the present disclosure.

DETAILED DESCRIPTION OF THE INVENTION

Figure 3:
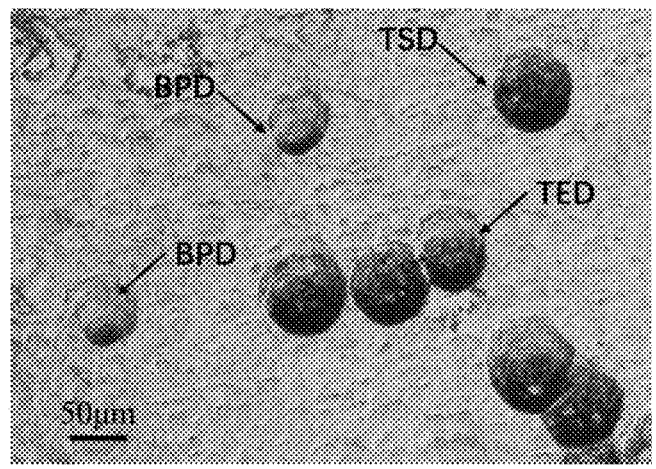
FIG. 3 is a schematic diagram of a carbon surface dislocation effect of a silicon carbide wafer etched in the method for preferential etching of dislocation of the silicon carbide wafer according to an embodiment of the present disclosure.

The technical solutions in the embodiments of the present disclosure will be described clearly and completely in conjunction with the accompanying drawings in the embodiments of the present disclosure. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Referring to FIG. 1, an embodiment provides a technical solution: a method for preferential etching of dislocation of a silicon carbide wafer includes the following steps:

S100: providing a silicon carbide wafer and placing the silicon carbide wafer in a crucible, wherein the crucible contains an etchant and a silicon carbide accompanying wafer therein, the silicon carbide accompanying wafer is placed above the etchant and the silicon carbide wafer is placed above the silicon carbide accompanying wafer; the silicon carbide accompanying wafer includes a first surface and a second surface, wherein the first surface of the silicon carbide accompanying wafer faces the etchant, the second surface of the silicon carbide accompanying wafer faces a carbon surface of the silicon carbide wafer, a size of the silicon carbide accompanying wafer is matched with that of the inner wall of the crucible, a gap is reserved between the side edge of the silicon carbide accompanying wafer and the inner wall of the crucible, and a distance between the carbon surface of the silicon carbide wafer and the second surface of the silicon carbide accompanying wafer is smaller than or equal to a predetermined distance; and

S200: heating the crucible based on a heating process, wherein etchant vapor formed by heating etches the silicon carbide wafer and the silicon carbide accompanying wafer to obtain the etched silicon carbide wafer.

In the case that S100 is performed, the distance between the carbon surface of the silicon carbide wafer and the second surface of the silicon carbide accompanying wafer being smaller than or equal to the predetermined distance includes: contacting the carbon surface of the silicon carbide wafer with the second surface of the silicon carbide accompanying wafer, wherein the predetermined distance is specifically 0.5 mm, and a distance range of the gap is 0.5 mm to 5 mm.

In addition, in this embodiment, a bracket is also disposed in the crucible, located between the etchant and the silicon carbide accompanying wafer, and used to fix the silicon carbon accompanying wafer. The crucible is a nickel crucible with a lid, and the bracket is a nickel mesh bracket. In addition, the etchant selected in this embodiment is a potassium hydroxide solid or a sodium hydroxide solid, and the etchant vapor is corresponding potassium hydroxide vapor or sodium hydroxide vapor. In other embodiments, other types of etchants can also be selected.

In this embodiment, two surfaces of the silicon carbide accompanying wafer are a carbon surface and a silicon surface respectively. Whether the first surface of the silicon carbide accompanying wafer is the carbon surface or the silicon surface, and whether the second surface of the silicon carbide accompanying wafer is the corresponding silicon surface or carbon surface are not limited in this embodiment. However, it should be noted that when the silicon carbide accompanying wafer is placed above the etchant, the silicon carbide accompanying wafer is etched by the etchant vapor, thereby reducing the concentration of the etchant vapor reaching the carbon surface of the silicon carbide wafer. Therefore, the silicon carbide accompanying wafer cannot be in direct contact with the etchant.

Specifically, as shown in FIG. 2, the crucible 2 is filled with an etchant 3; a bracket 4 is disposed above the etchant 3, and a silicon carbide accompanying wafer 5 is placed on the bracket; a sample to be etched, i.e., a silicon carbide wafer 6 is placed on the first surface, i.e., the upper surface of the silicon carbide accompanying wafer 5, and a distance between a carbon surface of the silicon carbide wafer and the upper surface of the silicon carbide accompanying wafer is less than or equal to 1 mm; and a distance between a second surface, i.e., the lower surface, of the silicon carbide accompanying wafer and the upper surface of the etchant is less than or equal to 0.5 mm. However, in this embodiment, dislocations formed on the carbon surface of the silicon carbide wafer which is etched by contacting the carbon surface of the silicon carbide wafer with the upper surface of the silicon carbide accompanying wafer for preferential etching are distinguished more clearly, which is more conducive to distinguishing different kinds of dislocations on the carbon surface of the etched silicon carbide wafer. However, it should be noted that although the surface of the silicon carbide wafer is smooth, there will be stress concentration during the cutting and grinding process due to high hardness of silicon carbide, such that the entire silicon carbide wafer will be warped and have a curvature like a plate. Therefore, in the case that the carbon surface of the silicon carbide wafer is in contact with the upper surface of the silicon carbide accompanying wafer, there will still be a gap, such that the etchant vapor can enter the carbon surface of the silicon carbide wafer and etch the carbon surface.

In this embodiment, the upper surface of the silicon carbide accompanying wafer 5 is the carbon surface, and the lower surface of the silicon carbide accompanying wafer 5 is the silicon surface. However, in other embodiments, the upper surface of the silicon carbide accompanying wafer 5 may be the silicon surface, and the lower surface of the silicon carbide accompanying wafer 5 may be the carbon surface, which will not be limited in this embodiment.

Figure 4:
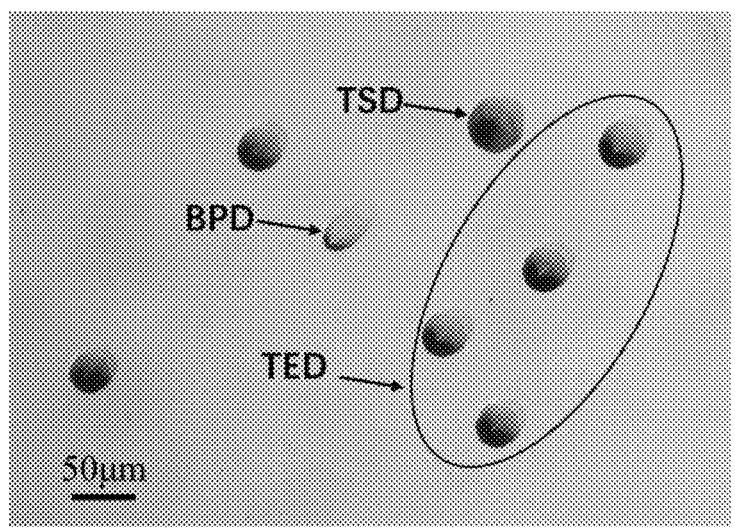
FIG. 4 is a schematic diagram of a silicon surface dislocation effect of a silicon carbide wafer etched in the method for preferential etching of dislocation of the silicon carbide wafer according to an embodiment of the present disclosure.

In this embodiment, the specific preferential etching process is as follows: a nickel crucible with a lid is provided, an opening size of the nickel crucible being 10 mm×25 mm; an appropriate amount of etchant is placed at the bottom of the nickel crucible, wherein 10 g of potassium hydroxide solid may be selected; next, a nickel mesh bracket is placed above the etchant, and then a silicon carbide accompanying wafer is laid on the nickel mesh bracket, wherein a gap between the side edge of the silicon carbide accompanying wafer and the inner wall of the nickel crucible ranges from 0.5 mm to 5 mm; a sample to be etched, that is, the silicon carbide wafer is placed on the silicon carbide accompanying wafer, and the carbon surface of the silicon carbide wafer faces downward in contact with the upper surface of the silicon carbide accompanying wafer, and the crucible lid is closed;

an etching furnace is heated to a specified temperature, wherein the temperature range is 800° C. to 1100° C.; the prepared nickel crucible is put in the center of a heating zone of the etching furnace, and after maintaining for a set time, the preferential etching is completed; the nickel crucible is taken out and placed in a fume hood, the crucible lid is opened and the etched silicon carbide wafer is taken out; the etched silicon carbide wafer is subjected to ultrasonic cleaning, blow-dried with nitrogen after the completion of cleaning, and then observed under an optical microscope; as shown in a carbon surface etching effect diagram in FIG. 3, it is possible to clearly distinguish threading screw dislocations TSD, threading edge dislocations TED and basal plane dislocations BPD, wherein the threading screw dislocations TSD appear as black oval shapes, the threading edge dislocations TED appear as oval shapes each consisting of a light-colored tail and a black head, and the basal plane dislocations BPD appear as light-colored oval shapes; and as shown in a silicon surface etching effect diagram in FIG. 4, it is possible to distinguish threading screw dislocations TSD, threading edge dislocations TED and basal plane dislocations BPD.

Firstly, in this embodiment, the etchant is heated to form etchant vapor at high temperature, and preferential etching is then performed based on the etchant vapor in order to reduce the concentration of the etchant, thereby reducing an etching reaction rate. Secondly, in this embodiment, the silicon carbon accompanying wafer is also adopted, wherein the size of the silicon carbide accompanying wafer is slightly smaller than the cross section of the crucible, so as to play a role of blocking the etchant vapor, such that most of the etchant vapor is blocked under the silicon carbide accompanying wafer and the silicon carbide wafer. In addition, the gap between the silicon carbide accompanying wafer and the carbon surface of the silicon carbide wafer is also very small, resulting in less etchant vapor reaching the carbon surface of the silicon carbide wafer, thereby further reducing the etching reaction speed of the carbon surface of the silicon carbide wafer. Furthermore, the etchant vapor will react with the silicon surface of the silicon carbide accompanying wafer at the same time, and will also reduce the concentration of the etchant vapor when it reacts with the carbon surface of the silicon carbide wafer, and finally make the carbon surface of the silicon carbide wafer form distinguishable dislocations, so that distinguishable dislocations can be obtained on both the silicon surface and carbon surface of the silicon carbide wafer.

In this embodiment, the etchant vapor at high temperature is used for preferential etching, the etchant vapor is blocked by using the silicon carbide accompanying wafer, and the silicon carbide accompanying wafer and the silicon carbide wafer are synchronously etched to reduce the concentration of the etchant vapor on the carbon surface of the silicon carbide wafer, thereby effectively reducing the concentration of the etchant while ensuring the high-temperature etching activity, and exposing the dislocations on the carbon surface of the silicon carbide wafer. Therefore, dislocation etching pits with distinguishing degree similar to those on the silicon surface are obtained on the carbon surface of the silicon carbide wafer and thus identified clearly.

Based on the same inventive concept, the present disclosure further provides a device for preferential etching of dislocation of a silicon carbide wafer. The device includes a crucible, wherein the crucible is used to place an etchant, a silicon carbide wafer and a silicon carbide accompanying wafer therein; the silicon carbide accompanying wafer is placed above the etchant and the silicon carbide wafer is placed above the silicon carbide accompanying wafer; the silicon carbide accompanying wafer includes a first surface and a second surface, wherein the first surface of the silicon carbide accompanying wafer faces the etchant, the second surface of the silicon carbide accompanying wafer faces a carbon surface of the silicon carbide wafer, a size of the silicon carbide accompanying wafer is matched with that of the inner wall of the crucible, a gap is reserved between the side edge of the silicon carbide accompanying wafer and the inner wall of the crucible, and a distance between the carbon surface of the silicon carbide wafer and the second surface of the silicon carbide accompanying wafer is smaller than or equal to a predetermined distance; and the crucible is heated based on a heating process, wherein etchant vapor formed by heating etches the silicon carbide wafer and the silicon carbide accompanying wafer to obtain the etched silicon carbide wafer.

In this embodiment, the distance between the carbon surface of the silicon carbide wafer and the second surface of the silicon carbide accompanying wafer being smaller than or equal to the predetermined distance includes: contacting the carbon surface of the silicon carbide wafer with the second surface of the silicon carbide accompanying wafer.

The predetermined distance is 0.5 mm, and a distance range of the gap is 0.5 mm to 5 mm.

A bracket is also disposed in the crucible; and the bracket is used to fix the silicon carbon accompanying wafer.

The preferred embodiments have been disclosed by the present disclosure, but are not intended to limit the present disclosure. Any person skilled in the art may make possible changes and amendments to the technical solution of the present disclosure using the methods and technical content disclosed above, without departing from the spirit and scope of the present disclosure. Therefore, any simple amendment, equivalent change and modification made to the above embodiments based on the technical essence of the present disclosure without departing from the content of the technical solution of the present disclosure fall within the protection scope of the technical solution of the present disclosure.

The invention claimed is:

1. A method for preferential etching of dislocation of a silicon carbide wafer, comprising the following steps:
providing a silicon carbide wafer and placing the silicon carbide wafer in a crucible, wherein the crucible contains an etchant and a silicon carbide accompanying wafer therein, the silicon carbide accompanying wafer is placed above the etchant and the silicon carbide wafer is placed above the silicon carbide accompanying wafer; the silicon carbide accompanying wafer comprises a first surface and a second surface, wherein the first surface of the silicon carbide accompanying wafer faces the etchant, the second surface of the silicon carbide accompanying wafer faces a carbon surface of the silicon carbide wafer, a size of the silicon carbide accompanying wafer is matched with that of the inner wall of the crucible, a gap is reserved between the side edge of the silicon carbide accompanying wafer and the inner wall of the crucible, and a distance between the carbon surface of the silicon carbide wafer and the second surface of the silicon carbide accompanying wafer is smaller than or equal to a predetermined distance, such that distinguishable dislocations are formed on the carbon surface of the subsequent etched silicon carbide wafer; and
heating the crucible based on a heating process, wherein etchant vapor formed by heating etches the silicon carbide wafer and the silicon carbide accompanying wafer to obtain the etched silicon carbide wafer.

2. The method for preferential etching of dislocation of the silicon carbide wafer according to claim 1, wherein the distance between the carbon surface of the silicon carbide wafer and the second surface of the silicon carbide accompanying wafer being smaller than or equal to the predetermined distance includes: contacting the carbon surface of the silicon carbide wafer with the second surface of the silicon carbide accompanying wafer.

3. The method for preferential etching of dislocation of the silicon carbide wafer according to claim 1, wherein the etchant is a potassium hydroxide solid or a sodium hydroxide solid, and the etchant vapor is corresponding potassium hydroxide vapor or sodium hydroxide vapor.

4. The method for preferential etching of dislocation of the silicon carbide wafer according to claim 1, wherein the predetermined distance is 0.5 mm, and a distance range of the gap is 0.5 mm to 5 mm.

5. The method for preferential etching of dislocation of the silicon carbide wafer according to claim 1, wherein a bracket is also disposed in the crucible; and the bracket is used to fix the silicon carbon accompanying wafer.

6. The method for preferential etching of dislocation of the silicon carbide wafer according to claim 5, wherein the crucible is a nickel crucible with a lid, and the bracket is a nickel mesh bracket.

* * * * *